United States Patent
Chen et al.

(10) Patent No.: US 7,754,027 B2
(45) Date of Patent: Jul. 13, 2010

(54) METHOD FOR MANUFACTURING A SPUTTERING TARGET

(75) Inventors: Rong-Zhi Chen, Kaohsiung (TW);
Jye-Long Lee, Kaohsiung (TW);
In-Ting Hong, Taipei (TW); Jui-Tung Chang, Tainan (TW); Pa-Tsui Sze, Kaohsiung (TW)

(73) Assignee: China Steel Corporation, Kaohsiung (TW)

( * ) Notice: Subject to any disclaimer, the term of this patent is extended or adjusted under 35 U.S.C. 154(b) by 330 days.

(21) Appl. No.: 11/892,755

(22) Filed: Aug. 27, 2007

(65) Prior Publication Data
US 2009/0056840 A1    Mar. 5, 2009

(51) Int. Cl.
*H01F 1/01* (2006.01)
(52) U.S. Cl. .................. 148/121; 148/120; 148/538; 148/540; 164/492; 164/48; 164/61; 164/122
(58) Field of Classification Search ............ None
See application file for complete search history.

(56) References Cited

U.S. PATENT DOCUMENTS

| | | | |
|---|---|---|---|
| 5,252,120 A * | 10/1993 | Finkl et al. ................ | 75/508 |
| 6,514,358 B1 * | 2/2003 | Bartholomeusz et al. .... | 148/300 |
| 6,905,750 B2 * | 6/2005 | Nee .......................... | 428/64.1 |
| 2007/0209741 A1 * | 9/2007 | Carpenter et al. ........... | 148/668 |

* cited by examiner

*Primary Examiner*—John P Sheehan
(74) *Attorney, Agent, or Firm*—Finnegan, Henderson, Farabow, Garrett & Dunner, L.L.P.

(57) ABSTRACT

A method for manufacturing a sputtering target includes the steps of: providing a highly pure matrix material containing a magnetic metal, and a highly pure precious metal ingot material; cleaning the surfaces of the matrix material and the precious metal ingot; vacuum melting the matrix material and the precious metal ingot to obtain a molten alloy; pouring the molten alloy in a mold having a cooling system while maintaining a surface of the molten alloy at a molten state by arc heating until the pouring is finished, thereby forming the molten alloy into a cast blank; hot working the cast blank; and annealing the cast blank after the hot working.

16 Claims, 3 Drawing Sheets

METHOD FOR MANUFACTURING A SPUTTERING TARGET

BACKGROUND OF THE INVENTION

1. Field of the Invention

The invention relates to a method for manufacturing a sputtering target, more particularly to a method for manufacturing a sputtering target used in a film sputtering process.

2. Description of the Related Art

A hard disk drive is one of the media for storing data. The data is stored in a magnetic recording layer of the hard disk drive. The magnetic recording layer is primarily made of a cobalt-based alloy containing a precious metal (for example, platinum), and is formed on a substrate using a sputtering target by a sputtering process.

The sputtering process involves ion-bombarding the sputtering target using plasma, ejecting atoms from the surface of the target as a result of momentum transfer of the bombarding ions, and forming the magnetic recording layer on the substrate of the hard disk drive via adhesion, adsorption, surface-migration, and nucleation of the ejected atoms.

Since the manufacture of the hard disk drive involves specific technologies including electronic, semi-conductive, laser-optic, and precision machinery fields, the requirement for the sputtering target is relatively high. Therefore, the sputtering target can not be produced by a conventional atmospheric melt-casting process. Furthermore, since the sputtering target for forming the magnetic recording layer of the hard disk drive usually contains more than 30 wt % of precious metal (for example, platinum), it is desirable in the art to increase the yield of the precious metal in the sputtering target so as to avoid waste of the precious metal.

U.S. Pat. No. 6,797,137 discloses a target alloy, which is prepared by the following steps. Cobalt-chromium-boron master alloy powders are produced using conventional atomization or some other rapid solidification techniques. The master alloy powders are mechanically alloyed with platinum powders by ball milling. The resultant target alloy undergoes densification using a conventional hot isostatic pressing process to obtain the target alloy for the sputtering process for forming the magnetic recording layer of the hard disk drive. However, since it is not easy to obtain a homogeneous alloy by ball milling, the composition of the target alloy obtained thereby is not uniform, which may adversely affect the quality of the magnetic recording layer formed from the target alloy.

Taiwanese Patent No. I226907 discloses a method for preparing a sputtering target using a vacuum induction melting process and a vacuum arc remelting process so as to produce a highly pure cobalt-chromium alloy target. The vacuum arc remelting process is conducted in which an ingot produced by the vacuum induction melting process is used as a negative electrode and a copper crucible is used as a positive electrode so as to obtain a cast blank. However, since the ingot produced by the vacuum induction melting process has a shrinkage defect of more than 40%, the ingot should be trimmed prior to use as the negative electrode in the vacuum arc remelting process. Therefore, the yield of the sputtering target prepared by the method of the Taiwanese patent is usually lower than 60%.

Additionally, the equipments for performing the atomization process, the hot isostatic pressing process, the vacuum induction melting process, and the vacuum arc remelting process are relatively expensive. Therefore, the production cost of the prior art is relatively high.

SUMMARY OF THE INVENTION

Therefore, the object of the present invention is to provide a method for manufacturing a sputtering target having advantages of a high yield, a high purity, and a homogenous composition.

Accordingly, the method for manufacturing a sputtering target of this invention includes the steps of: providing a highly pure matrix material containing a magnetic metal, and a highly pure precious metal ingot material; cleaning the surfaces of the matrix material and the precious metal ingot; vacuum melting the matrix material and the precious metal ingot to obtain a molten alloy; pouring the molten alloy in a mold having a cooling system while maintaining a surface of the molten alloy at a molten state by arc heating until the pouring is finished, thereby forming the molten alloy into a cast blank; hot working the cast blank; and annealing the cast blank after the hot working.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
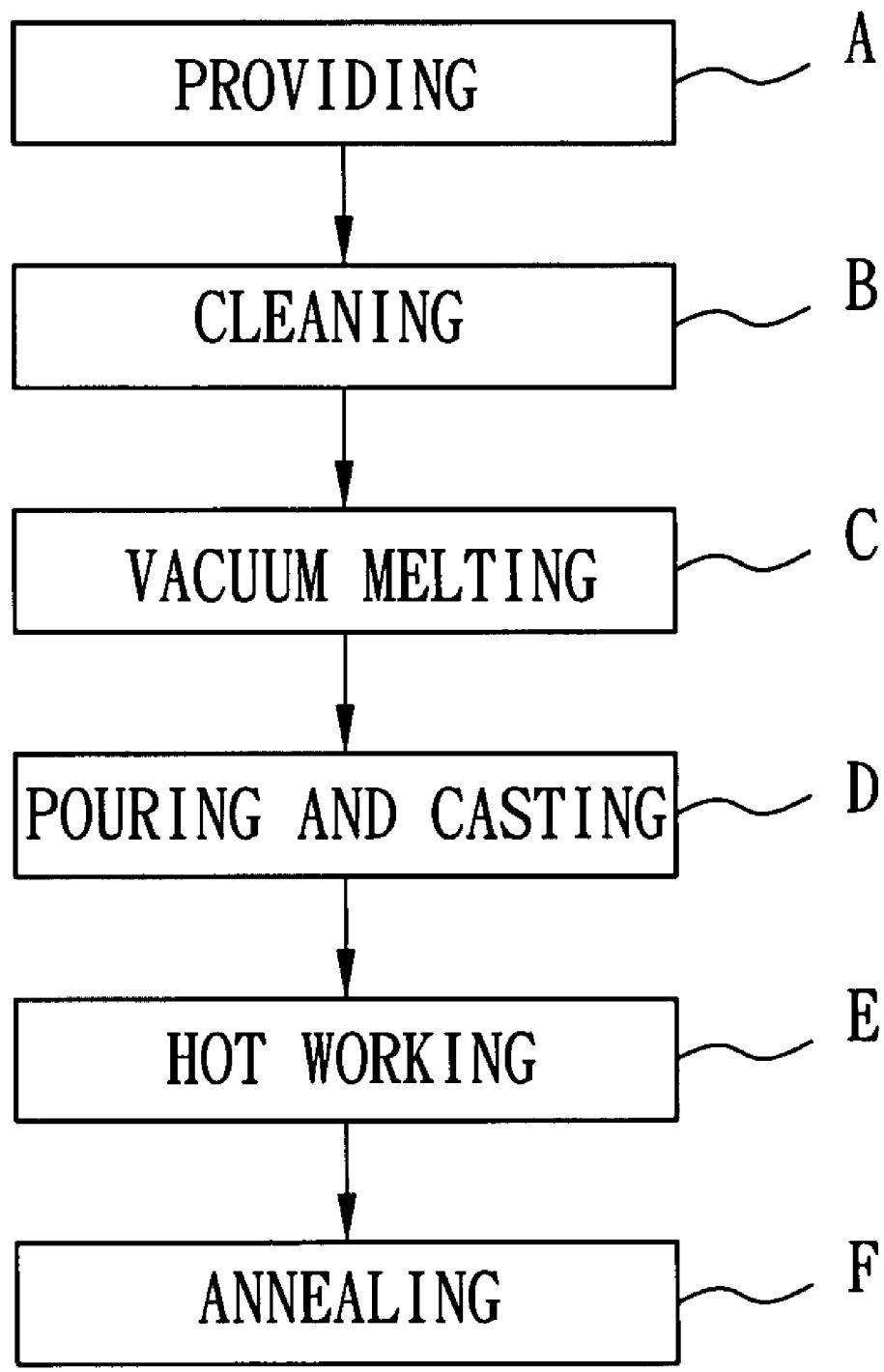
FIG. 1 is a flow diagram of a preferred embodiment of a method for manufacturing a sputtering target according to this invention.

Referring to FIG. 1, the preferred embodiment of a method for manufacturing a sputtering target according to this invention includes the steps of:

A) Preparation:

A highly pure matrix material containing a magnetic metal, and a highly pure precious metal ingot material are prepared. Preferably, a chromium metal is contained in the matrix material. The magnetic metal suitable for the matrix material is preferably iron, cobalt, nickel, or the combinations thereof. In the preferred embodiment, a cobalt ingot material is used as the matrix material. The precious metal ingot material is preferably made of platinum, palladium, gold, silver, rhodium, iridium, ruthenium, osmium, or combinations thereof.

B) Cleaning:

The surfaces of the matrix material and the precious metal ingot material are cleaned by ultra-sonicating the matrix material and the precious metal ingot material in an acidic solution to remove oxides and dirt from the surfaces thereof, and then ultra-sonicating the matrix material and the precious metal ingot material in a deionized water to remove the acidic solution from the surfaces thereof. The deionized water that remains on the surfaces of the matrix material and the precious metal ingot material is removed by baking. The acidic solution used in the preferred embodiment is a nitric acid solution at a concentration of at least 95 vol. %. Other acidic solutions useable in the present invention include a phosphoric acid solution, a hydrochloric acid solution, a hydrofluoric acid solution, a nitrohydrochloric acid solution, and the like.

C) Vacuum Melting:

45-60 wt % of cobalt, 5-27 wt % of chromium, 25-45 wt % of the precious metal, and optionally 0-5 wt % of boron are vacuum melted (e.g., by vacuum induction melting or vacuum arc melting) to obtain a molten alloy.

D) Pouring and Casting:

The molten alloy is poured in a mold having a cooling system while maintaining a surface of the molten alloy at a molten state by arc heating until the pouring is finished, thereby forming the molten alloy into a cast blank. The mold used in the present invention is a copper mold having a high thermo conductivity.

E) Hot Working:

The cast blank is hot worked (e.g., forged or rolled) to form a predetermined profile. Preferably, the hot working process is conducted at a temperature ranging from 0.75 to 0.85 times of a melting temperature of the cast blank.

F) Annealing:

The cast blank after the hot working is annealed to obtain the sputtering target. The annealing process is conducted at a temperature of 100-300° C. below the temperature used in the step E) and for a duration ranging from 1 to 2 hours. The sputtering target can be further sliced and surface cleaned to obtain sputtering target slices for the subsequent sputtering process. Annealing can be conducted in an ambient atmosphere or a protective atmosphere, such as an argon atmosphere.

EXAMPLE 1

A cobalt ingot material, a chromium ingot material, and a platinum ingot material, each of which has a purity of at least 99.95 wt %, were provided, and were cleaned by ultra-sonicating the cobalt ingot material, the chromium ingot material, and the platinum ingot material in a nitric acid solution at a concentration of at least 95 vol. % to remove oxides and dirt from the surfaces thereof, and then ultra-sonicating the cobalt ingot material, the chromium ingot material, and the platinum ingot material in a deionized water to remove the nitric acid solution from the surfaces thereof. The deionized water that remained on the surfaces of the cobalt ingot material, the chromium ingot material, and the platinum ingot material was removed by baking.

50 wt % of the cobalt ingot material, 8 wt % of the chromium ingot material, and 42 wt % of the platinum ingot material were vacuum melted by vacuum induction melting in a vacuum melting furnace to obtain a molten alloy. The molten alloy was poured in a copper mold having a cooling system while maintaining a surface of the molten alloy at a molten state by arc heating until the pouring was finished, thereby forming the molten alloy into a cast blank.

The cast blank was hot worked by forging at a temperature of 0.85 times of a melting temperature of the cast blank (i.e., at a temperature of 1200° C.) to form a predetermined profile. The cast blank after the hot working was annealed in an ambient atmosphere at a temperature of 300° C. below the temperature used in the hot working (i.e., at a temperature of 900° C.) and for 2 hours to obtain a sputtering target. The sputtering target was further sliced and surface cleaned to obtain sputtering target slices for the subsequent sputtering process.

Figure 2:
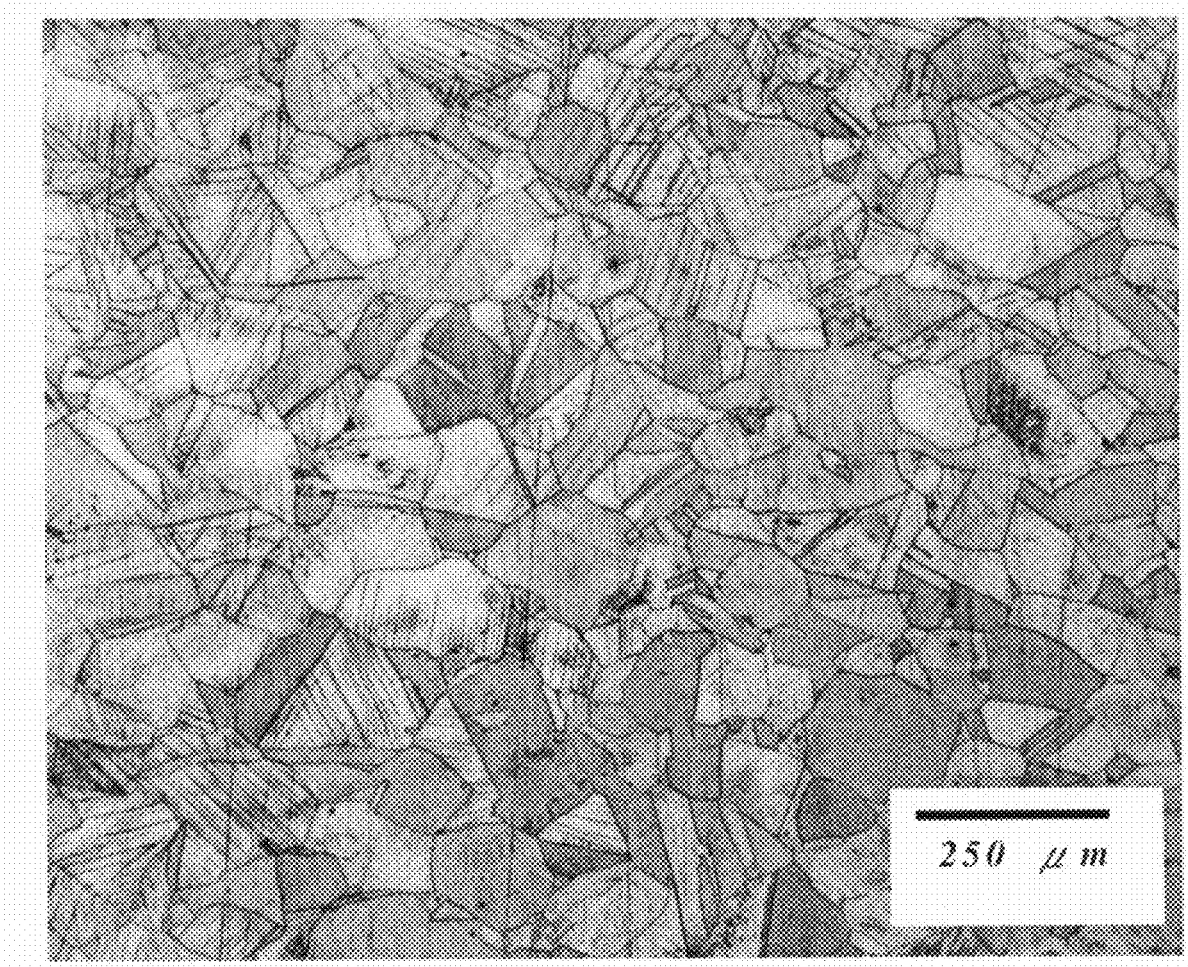
FIG. 2 is a microscopic photograph showing the microscopic structure of a sputtering target manufactured by the preferred embodiment.

The sputtering target obtained by the present method has a yield of about 94%, and the microscopic structure thereof is shown in FIG. 2. It is shown in FIG. 2 that the sputtering target has a uniform structure in an isometric crystal form, and has a grain size smaller than 150 µm.

EXAMPLE 2

A cobalt ingot material, a chromium ingot material, and a platinum ingot material, each of which has a purity of at least 99.95 wt %, were provided, and were cleaned by ultra-sonicating the cobalt ingot material, the chromium ingot material, and the platinum ingot material in a hydrochloric acid solution at a concentration of at least 95 vol. % to remove oxides and dirt from the surfaces thereof, and then ultra-sonicating the cobalt ingot material, the chromium ingot material, and the platinum ingot material in a deionized water to remove the hydrochloric acid solution from the surfaces thereof. The deionized water that remained on the surfaces of the cobalt ingot material, the chromium ingot material, and the platinum ingot material was removed by baking.

54 wt % of the cobalt ingot material, 14 wt % of the chromium ingot material, 31 wt % of the platinum ingot material, and 1 wt % of boron were vacuum melted by vacuum arc melting in a vacuum melting furnace to obtain a molten alloy. The molten alloy was poured in a copper mold having a cooling system while maintaining a surface of the molten alloy at a molten state by arc heating until the pouring was finished, thereby forming the molten alloy into a cast blank.

The cast blank was hot worked by rolling at a temperature of 0.75 times of a melting temperature of the cast blank (i.e., at a temperature of 1100° C.) to form a predetermined profile. The cast blank after the hot working was annealed in a protective atmosphere (i.e., an argon atmosphere) at a temperature of 100° C. below the temperature used in the hot working (i.e., at a temperature of 1000° C.) and for 1 hour to obtain a sputtering target. The sputtering target was further sliced and surface cleaned to obtain sputtering target slices for the subsequent sputtering process.

Figure 3:
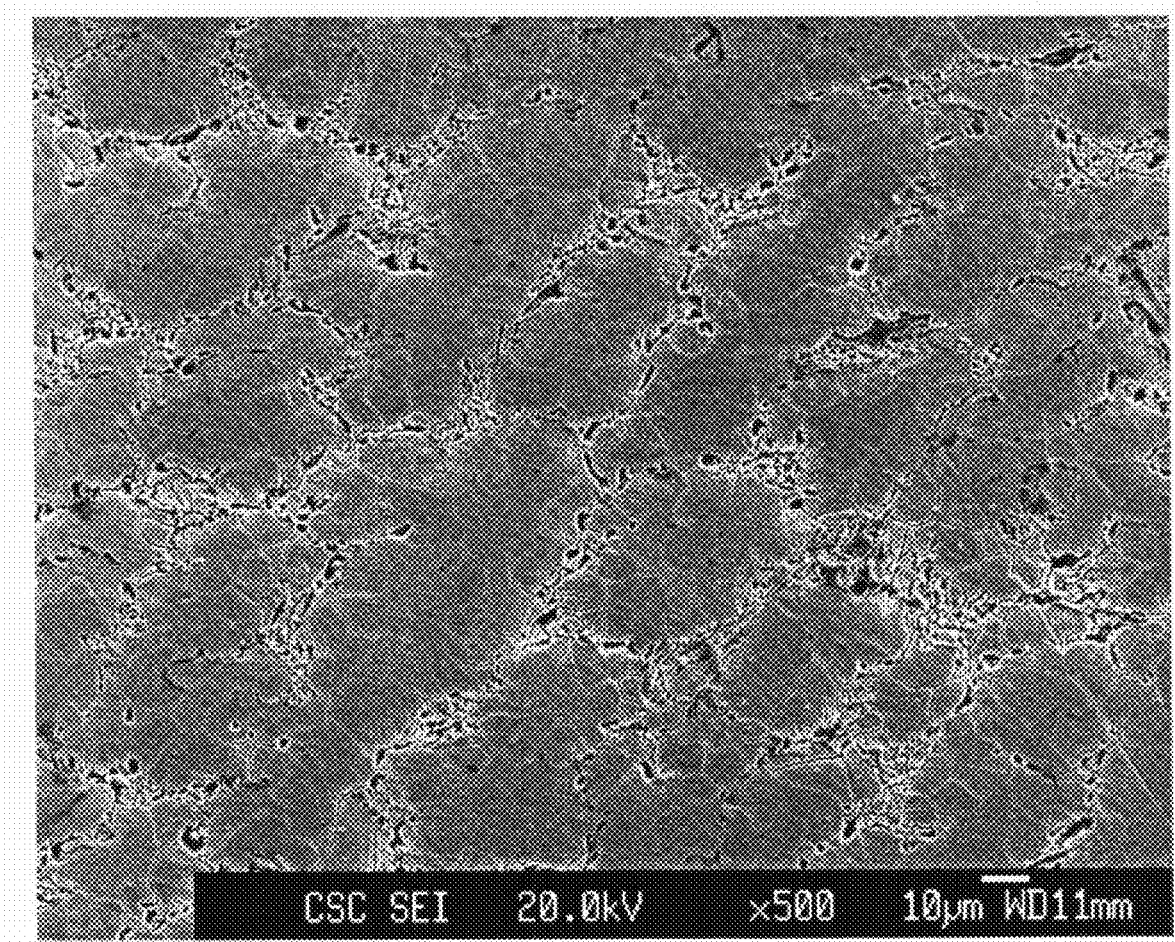
FIG. 3 is a microscopic photograph showing the microscopic structure of another sputtering target manufactured by the preferred embodiment.

The sputtering target obtained by the present method has a yield of about 92%, and the microscopic structure thereof is shown in FIG. 3. It is shown in FIG. 3 that the sputtering target has a uniform structure in an isometric crystal form, and has a grain size smaller than 80 µm.

In view of the aforesaid, the method for manufacturing the sputtering target of the present invention has the following advantages:

1. In the pouring and casting step of the method of the present invention, the molten alloy is poured in a mold having a cooling system while maintaining a surface of the molten alloy at a molten state by arc heating until the pouring is finished. The disadvantage of the shrinkage defect encountered in the prior art can be avoided thereby. Therefore, the yield can be increased, and the production cost can be reduced.

2. The molten alloy is formed by vacuum melting at a vacuum atmosphere so as to prevent entrapment of impurities in the alloy. Therefore, the sputtering target manufactured by the method of the present invention has a relatively uniform structure as compared to the sputtering target of the prior art obtained by ball milling.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method for manufacturing a sputtering target, comprising the steps of:
   a) preparing a highly pure matrix material, and a highly pure precious metal ingot material, the highly pure matrix material being made of a magnetic metal;
   b) cleaning the surfaces of the matrix material and the precious metal ingot;
   c) vacuum melting the matrix material and the precious metal ingot to obtain a molten alloy;
   d) pouring the molten alloy in a mold that is being cooled while maintaining a surface of the molten alloy in the mold at a molten state by arc heating until the pouring is finished, thereby forming the molten alloy into a cast blank;
   e) hot working the cast blank; and
   f) annealing the cast blank after the hot working.

2. The method as claimed in claim 1, wherein the matrix material is made of one or more of the magnetic metals selected from the group consisting of iron, cobalt, and nickel.

3. The method as claimed in claim 2, wherein the precious metal ingot is made of one or more of precious metals selected from the group consisting of platinum, palladium, gold, silver, rhodium, iridium, ruthenium, and osmium.

4. The method as claimed in claim 3, wherein the matrix material has a purity of at least 99.95 wt %.

5. The method as claimed in claim 3, wherein the precious metal ingot has a purity of at least 99.95 wt %.

6. The method as claimed in claim 3, further comprising a step of:
   preparing a chromium ingot material, cleaning the chromium ingot material, and vacuum melting the chromium ingot material together with the highly pure matrix material and the highly pure precious metal ingot material to form the molten alloy, the molten alloy containing 45-60 wt % of cobalt, 5-27 wt % of chromium, and 25-45 wt % of the precious metal.

7. The method as claimed in claim 1, wherein the step b) is conducted by ultra-sonicating the matrix material and the precious metal ingot in an acidic solution to remove oxides and dirt from the surfaces of the matrix material and the precious metal ingot, and then ultra-sonicating the matrix material and the precious metal ingot in a deionized water to remove the acidic solution from the surfaces of the matrix material and the precious metal ingot.

8. The method as claimed in claim 7, wherein the acidic solution is selected from the group consisting of a nitric acid solution, a phosphoric acid solution, a hydrochloric acid solution, a hydrofluoric acid solution, and a nitrohydrochloric acid solution.

9. The method as claimed in claim 1, wherein the step e) is conducted at a temperature ranging from 0.75 to 0.85 times of a melting temperature of the cast blank.

10. The method as claimed in claim 9, wherein the step f) is conducted at a temperature of 100-300° C. below the temperature used in the step e) and for a duration ranging from 1 to 2 hours.

11. The method as claimed in claim 6, further comprising a step of:
    vacuum melting boron together with the highly pure matrix material, the highly pure precious metal ingot material, and the chromium ingot material to form the molten alloy, the molten alloy further containing 5 wt % of boron.

12. The method as claimed in claim 1, wherein the step c) is conducted by a process selected from the group consisting of vacuum induction melting and vacuum arc melting.

13. The method as claimed in claim 1, wherein the step e) is conducted by a process selected from the group consisting of forging and rolling.

14. The method as claimed in claim 1, wherein the step f) is conducted in an ambient atmosphere.

15. The method as claimed in claim 1, wherein the step f) is conducted in a protective atmosphere.

16. The method as claimed in claim 15, wherein the protective atmosphere is an argon atmosphere.

* * * * *